United States Patent
Butterbaugh et al.

[11] Patent Number: 6,061,240
[45] Date of Patent: *May 9, 2000

[54] PUSH PIN ASSEMBLY FOR HEAT SINK FOR COOLING ELECTRONIC MODULES

[75] Inventors: Matthew Allen Butterbaugh, Rochester; Roger Duane Hamilton, Eyota; Sukhvinder Singh Kang, Rochester, all of Minn.

[73] Assignee: International Business Machines Corporation, Armonk, N.Y.

[ * ] Notice: This patent is subject to a terminal disclaimer.

[21] Appl. No.: 09/153,607

[22] Filed: Sep. 15, 1998

Related U.S. Application Data

[63] Continuation of application No. 08/915,059, Aug. 20, 1997.

[51] Int. Cl.[7] .................................................. H05K 7/20
[52] U.S. Cl. .......................... 361/704; 361/707; 361/708; 361/709; 361/710; 361/717; 361/718; 361/719; 257/718; 257/719; 165/80.2; 165/80.3; 411/508
[58] Field of Search ...................................... 361/704, 697, 361/707, 719; 411/508, 509, 908, 913; 24/453

[56] References Cited

U.S. PATENT DOCUMENTS

| | | | |
|---|---|---|---|
| 3,093,027 | 6/1963 | Rapata | 24/453 |
| 3,476,008 | 11/1969 | Pearson et al. | 411/508 |
| 4,987,639 | 1/1991 | Baiuley et al. | 16/126 |
| 5,035,154 | 7/1991 | Jonischus | 411/508 |
| 5,172,301 | 12/1992 | Schneider | 361/717 |
| 5,285,347 | 2/1994 | Fox et al. | 361/385 |
| 5,285,350 | 2/1994 | Villaume | 361/690 |
| 5,353,863 | 10/1994 | Yu | 165/80.3 |
| 5,370,178 | 12/1994 | Agonafer et al. | 165/137 |
| 5,384,940 | 1/1995 | Soule et al. | 24/453 |
| 5,467,251 | 11/1995 | Katchmar | 361/719 |
| 5,646,826 | 7/1997 | Katchmar | 361/719 |
| 5,651,652 | 7/1997 | Williams et al. | 411/508 |
| 5,703,752 | 12/1997 | Woo | 361/719 |
| 5,730,210 | 3/1998 | Kou | 361/704 |

OTHER PUBLICATIONS

Brochure entitled "T–flex 200 Series" by Thermagon, Inc.

*Primary Examiner*—Leo P. Picard
*Assistant Examiner*—Boris L. Chervinsky
*Attorney, Agent, or Firm*—Philip M. Kolhemainen; Matthew J. Bussan

[57] ABSTRACT

An array of electronic modules on the top of a circuit board is cooled by a heat sink secured to the bottom of the board. Vias transfer heat through the board to a compliant interface pad which permits heat to flow to the heat sink while maintaining electrical isolation between the vias. The heat sink is held on the board by push pin assemblies including springs that compress the interface pad between the circuit board and the heat sink. The body of each push pin assembly includes flexing legs supporting locking barbs, and flex of the legs is limited by a strut defining a closed end slot in the shank of the body.

3 Claims, 2 Drawing Sheets

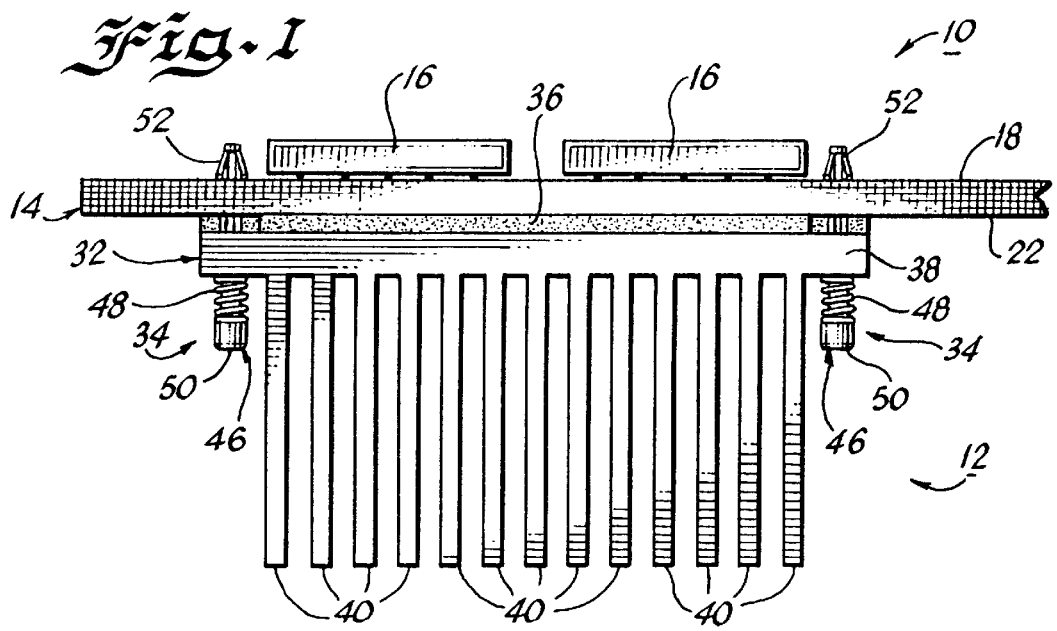
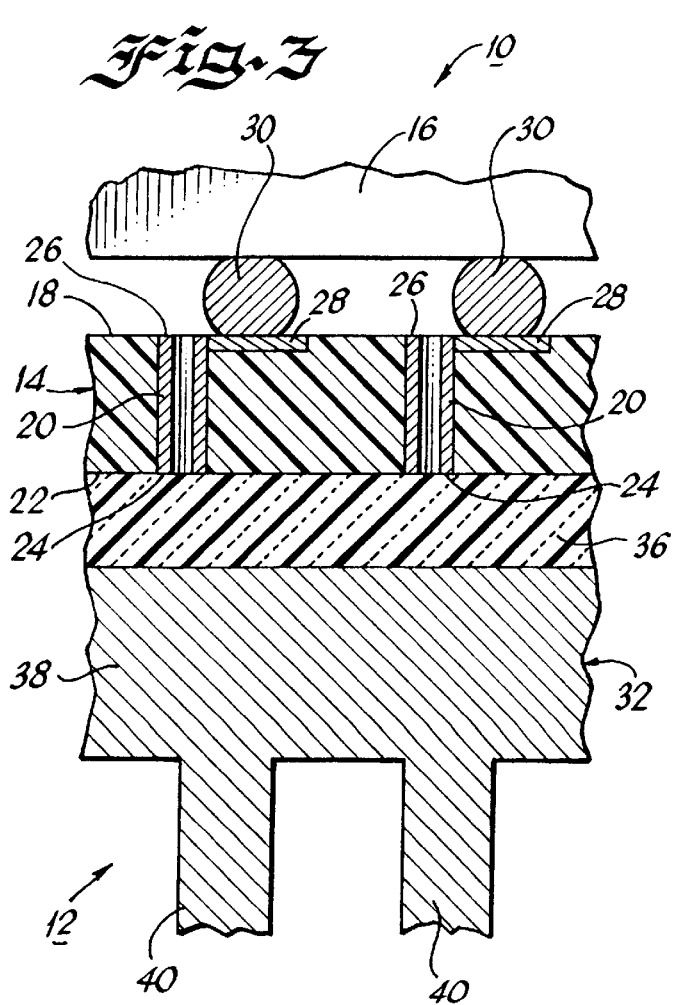
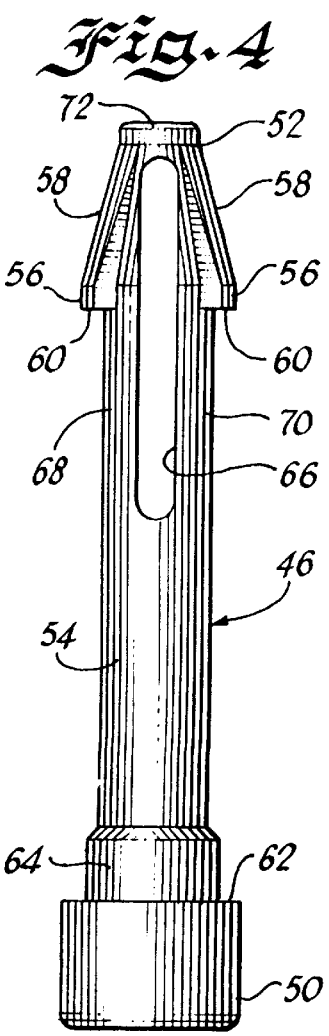

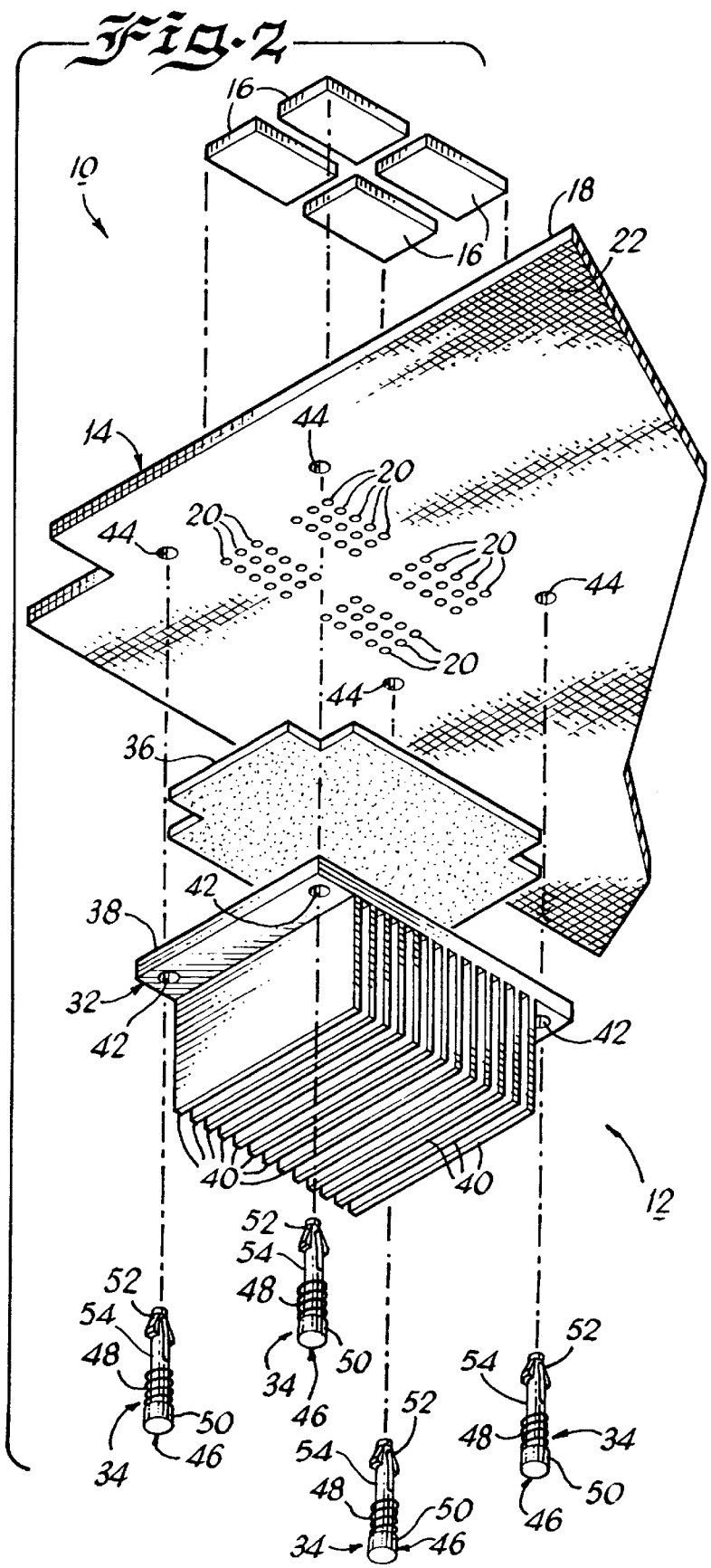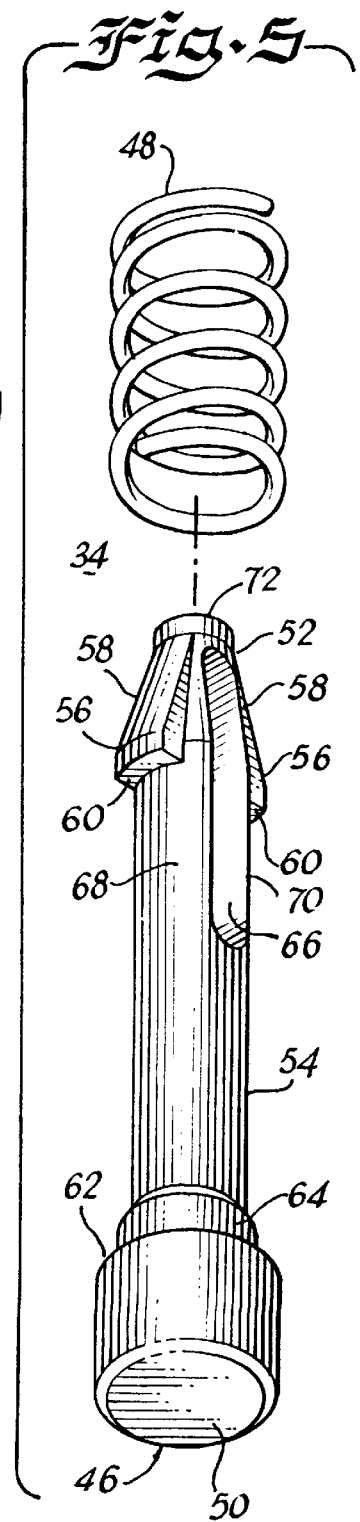

PUSH PIN ASSEMBLY FOR HEAT SINK FOR COOLING ELECTRONIC MODULES

This is a continuing application of application Ser. No. 08/915,059 filed Aug. 20, 1997.

FIELD OF THE INVENTION

The present invention relates to improvements in heat sink assemblies for cooling electronic modules mounted on a circuit board.

DESCRIPTION OF THE PRIOR ART

Electronic modules include numerous circuits operating at high speed and generate substantial heat. In many applications, it is necessary to cool the modules in order to maintain specified temperatures and assure that the modules function properly and reliably. In the past, various approaches have been used to cool electronic modules. A common approach is to mount a finned metal heat sink in heat transfer relation upon the top of the module. U.S. Pat. Nos. 5,285,347 and 5,353,863 disclose examples of arrangements wherein a finned heat sink is mounted upon the top of an electronic module.

With emerging module types such as ball grid array (BGA) modules, the leads may be relatively fragile. One disadvantage of the known arrangement wherein a heat sink is secured to the top of the module is that the mass of the heat sink is added to the mass of the module and must be supported by the module leads soldered to the circuit board. The leads may lack sufficient strength to support both the module and a heat sink.

With electronic modules such as memory chips, an array of many discrete chips may be mounted to the surface of a single circuit board. Each of the chips of the array must be cooled. Using a discrete heat sink for each chip as disclosed in U.S. Pat. No. 5,285,347 results in an expensive assembly having many parts and assembly operations. In addition, this conventional assembly permits temperature variations among the different modules, and this can result in timing performance variations.

Some of the disadvantages of using a separate heat sink for each chip an be avoided by employing a larger heat sink used simultaneously to cool a number of chips. U.S. Pat. Nos. 5,285,350 and 5,370,178 disclose cooling modules or heat sinks that overlie an array of several electronic modules in order to cool them all simultaneously. The heat sinks disclosed in these patents are secured by fasteners or clips to the circuit board and are supported above the chips in heat transfer relationship to the top surfaces of the chips. This mounting arrangement requires space above the top surface of the circuit board and above the top surfaces of the chips sufficient for accommodating the heat sink and permitting a sufficient flow of air over the heat sink. In some applications it would be desirable to cool modules without the necessity for additional space above the circuit board.

In some applications it is desirable to have access to the chips mounted on a circuit board. For example in an array of memory chips, it can be necessary to rework the assembly by removing and replacing a defective chip of the array. This is typically done by heating the assembly to reflow the solder holding the leads to the board. The presence of one or more heat sinks can interfere with rework of the assembly.

To facilite rework, various approaches have been used to mount a heat sink so that it can be removed. Flexible clips are used in the assembly of U.S. Pat. No. 3,353,863. Threaded screws are used in the assembly of U.S. Pat. No. 5,370,178.

U.S. Pat. No. 5,384,940 discloses a pin with an open-ended, bifurcated point that can be inserted through a heat sink and into a hole in a circuit board in order to secure the heat sink above a surface mount package. Prongs on the point engage the board when the pin is fully inserted, and a spring urges the heat sink down into contact with the package. A similar product sold by Aavid Engineering, Inc. of Laconia, N.H. is made of a nylon plastic material. The heat sink mounting pin disclosed in U.S. Pat. No. 5,384,940 and sold is subject to disadvantages. The sharp points defined by the open-ended bifurcation can catch on the board surface and interfere with movement of the pin through the board. The free standing prongs at the point of the pin are subject to excessive deformation and are lacking in strength. The prongs can take a set if not fully inserted and later fail to spring back resulting in an inability to secure the heat sink to the board.

SUMMARY OF THE INVENTION

A principal object of the present invention is to provide an improved heat sink assembly for cooling of electronic modules. More specifically, other objects of the invention are to provide a heat sink assembly that minimizes parts and labor assembly costs, that does not require added space above the circuit board on which the modules are mounted, that does not apply stress to component leads and does not interfere with access to components for rework and that encourages uniform module temperatures. Another object is to provide a module cooling heat sink assembly that overcomes disadvantages of those used in the past.

It is also an object of the invention to provide an improved push pin assembly for mounting a heat sink to a circuit board. Related objects are to provide a pin that is inserted easily into a hole without catching on the edge of the hole; to provide a pin having increased strength and resistance to deformation; and to provide a heat sink mounting pin that does not become permanently deformed if improperly installed.

In brief, in accordance with the present invention, there is provided an assembly for cooling a plurality of electrical modules mounted on the top surface of a circuit board. The circuit board includes an array of vias extending between the top and bottom surfaces of the circuit board. Each electrical module includes a plurality of leads, each lead being attached to a conductive region on the top surface of the circuit board connected to one of the vias. The assembly of this invention includes a metal heat sink aligned with the array of vias. A plurality of mounting elements attaches the heat sink to the bottom of the circuit board. A thermally conductive element contacts the bottom surface of the circuit board and the heat sink for conducting heat from the vias to the heat sink.

In brief, in accordance with another aspect of the invention there is provided a push pin assembly for mounting a heat sink to a circuit board. The heat sink and the circuit board have aligned mounting holes. The push pin assembly includes a pin body formed of a molded plastic material and having a push head at a first end and a point at the second end for insertion through the mounting hole of the heat sink and through the aligned mounting hole of the circuit board from an entry surface to an exit surface of the circuit board. The body has a shank extending between the head and the point. The second end of the body has barbs projecting radially beyond the shank for engaging the exit surface of the circuit board after insertion. A coil spring is captured around the shank and beneath the head for urging the heat sink toward the entry surface of the circuit board. A slot extends diametrically through the point and the shank to define a pair of spaced apart legs and to impart flexibility to the legs. A strut portion of the body closes the end of the slot and interconnects the ends of the legs at the distal end of the point.

BRIEF DESCRIPTION OF THE DRAWING

The present invention together with the above and other objects and advantages may best be understood from the following detailed description of the preferred embodiment of the invention illustrated in the drawings, wherein:

FIG. 1 is a side elevational view of a circuit board and electronic module assembly including a heat sink assembly embodying the present invention;

FIG. 2 is an exploded isometric view of the component of the circuit board and electronic module assembly of FIG. 1;

FIG. 3 is a greatly enlarged fragmentary vertical sectional view of part of the circuit board and electronic module assembly of FIG. 1;

FIG. 4 is an enlarged side elevational view of one of the heat sink mounting push pins of the assembly of FIG. 1; and FIG. 5 is an exploded isometric view of the push pin and its associated spring.

DETAILED DESCRIPTION OF THE PREFERRED EMBODIMENTS

Having reference now to the drawings, in FIG. 1 there is illustrated a circuit board and electronic module assembly generally designated as 10 including an module cooling assembly generally designated as 12 embodying the principles of the present invention. In general the assembly 10 includes a circuit board 14 and a plurality of modules 16 mounted upon the top surface 18 of the board 14. In the illustrated embodiment there is an array of four modules 16, however the principles of the invention can be employed with arrays of more or fewer modules.

Elements of the assembly 10 are illustrated in more detail in FIG. 3. The circuit board 14 is formed of an electrically insulating material such as fiberglass and includes a plurality of vias 20 each extending from the top surface 18 to a bottom surface 22 of the board. The vias 20 are tubular, cylindrical segments of conductive metal, normally copper. A lower end 24 of each via is exposed at the bottom surface 22 of the board. At the top surface 18, an upper end 26 of each via is exposed and is in electrical contact with a conductive copper region or contact pad 28. The circuit board 14 includes other conductive regions and layers including internal layers selectively contacting the vias 20, but these are not related to the present invention and are omitted from the drawing for clarity. The term "upper" or "top" of the circuit board 16 means the side of the circuit board upon which components are mounted regardless of eventual physical board orientation and the term "lower" or "bottom" means the side opposite the component mounting side.

The modules 16 may, for example, be static random access memory (SRAM) chips in the form of plastic ball grid array or PBGA modules having numerous electrical leads 30. One example of a BGA module has 119 leads in a seven by seventeen rectangular array with a lead to lead spacing of 0.050 inch, although the invention can be used with many other configurations and module types. The vias 20 and contact pads 28 are arrayed to correspond to the array of leads 30 and there is one via 20 and contact pad 28 for each lead 30. The leads 30 are in the form of balls of solder. The modules 16 are mounted to the top surface of the circuit board 16 by melting or reflowing the solder of the leads 30 to form an electrical connection and mechanical attachment between each lead 30 and its corresponding contact pad 28. Conductive layers or regions of the circuit board 14 selectively contact the vias 20 or the pads 28 and provide paths for signal, ground and power connections to the modules 16.

Heat is generated by the operation of the electrical elements within the modules 16. In the illustrated embodiment of the invention, the electronic module cooling assembly 12 removes heat from the modules to maintain the temperatures of the modules within a specified operating range to assure consistent and reliable module performance and life.

In general, the cooling assembly 12 includes a heat sink 32, mounting elements in the form of push pin assemblies 34 for attaching the heat sink 28 to the circuit board 16, and a thermally conductive element 36 for conducting heat to the heat sink 28. The heat sink 32 is attached to the lower surface 22 beneath the circuit board 16. As a result, the cooling assembly does not require space above the circuit board 16 and this is an advantage in applications where space above the board is limited. In addition, the assemblies 34 attach the heat sink 32 directly to the board and the mechanical attachment of the modules 16 to the contact pads 28 is not required to support the mass of the heat sink 32 in addition to the mass of the module 16.

The heat sink 32 is made of a thermally conductive metal such as aluminum and includes a base 38 and numerous fins 40 to provide a large surface area for the dissipation of heat. Preferably the fins 40 are oriented parallel to one another and parallel to the flow of cooling air within an enclosure. Each corner of the heat sink base 38 is provided with a mounting hole 42, and the circuit board 16 is provided with mounting holes 44 in the same pattern. To mount the heat sink 32 onto the circuit board 14, the holes 42 are aligned with the board holes 44 and the push pin assemblies 34 are inserted in an upward direction through the aligned holes 42 and 44. The push pin assemblies 34 resiliently bias the heat sink 32 toward the bottom surface 22 of the circuit board 14.

The circuit board vias 20 are used as paths for the flow of heat from the modules 16 to the heat sink 32. The thermally conductive element 36 conducts heat from the lower end 24 of each via 20 to the base 38 of the heat sink 32. In the illustrated embodiment the thermally conductive element is a planar, conformable, soft, elastic, electrically insulating and thermally conductive interface pad sandwiched between the bottom surface of the circuit board and the heat sink. A suitable material is T-FLEX 240 (200 SERIES) Thermally Conductive Conformable Gap Filler sold by Thermagon, Inc., 3256 West 25th Street, Cleveland, Ohio 44109-1668. Information about this material may be found at the web site www.thermagon.com.

FIGS. 4 and 5 illustrate one of the push pin assemblies 34. It includes a pin body 46 formed of a molded plastic material and a spring 48. The body 46 is a unitary, one-piece, homogeneous molded part having a push head 50 at one end and a point 52 at the opposite end. A shank 54 extends axially between the head 50 and point 52. A pair of barbs 56 extend radially from the body 46 in the region of the point 52. Each barb 56 has a sloped entry surface 58 and a radial lock shoulder 60.

The spring 48 is a coil spring that is installed over the barbs 56 and around the shank 54. The spring closely encircles the shank 54 and is captured between the lock shoulder 60 and an inner shoulder 62 of the head 50. A neck 64 at the transition of the head 50 and the shank 54 locates the spring 48 concentrically on the body 46.

A slot 66 extends diametrically through the shank 54 and point 52 and defines a pair of parallel, axially extending legs 68 and 70 spaced apart by the slot 66. The slot 66 extends perpendicular to a diameter line between the barbs 56, and one of the barbs 56 is located on each leg 68 and 70. Because of the characteristics of the molded plastic material of the body 46 and because of the slot 64, the legs are flexible and permit the barbs 56 to resiliently flex radially inwardly.

A strut portion 72 joins the ends of the legs 68 and 70 and defines the end of the slot 66. The strut 72 prevents relative radial movement of the ends of the legs 68 and 70 and stiffens the legs while permitting deflection of the portions of the barbs adjacent to the radial lock shoulders 60. As a result, the slot 66 is closed rather than open ended, and each leg flexes in the nature of a bridge fixed at both ends rather than as a cantilever beam free at one end.

The strut portion 72 is circular in shape and defines a blunt, circular end of the point 52. The circumference of the circular strut merges with the leading ends of the sloped barb surfaces 58. This configuration facilitates insertion of the point 52 into a mounting hole. There are no sharp ends and no free flexing leg ends to catch on a surface surrounding a mounting hole.

To install the cooling assembly 12 onto the circuit board 14, the interface pad 36 is located between the base 38 of the heat sink 32 and the bottom surface 22 of the circuit board. The interface pad is aligned with and overlies all of the vias 20 extending from the modules 16. The mounting holes 42 of the heat sink 32 are aligned with the mounting holes 44 of the circuit board 14, and the push pin assemblies 34 are installed.

The head 50 of the push pin assembly 34 is held in the hand and the point 52 is inserted through the aligned holes 42 and 44. The blunt point 52 defined by the strut 72 fits easily into the holes 42 and 44 without catching or sticking. The barbs in their relaxed state are separated by a distance greater than the mounting hole diameter. The sloping barb surfaces 58 guide the pin body 46 axially through the holes and react with the holes to cause inward radial deformation of the legs 68 and 70, permitting the barbs 56 to pass through the mounting holes. When the pin assembly 34 is fully inserted, legs 68 and 70 flex radially outwardly to their relaxed positions and the radial lock shoulders 60 of the barbs 56 overly the top surface 18 of the circuit board 18 to prevent withdrawal of the pin assembly 34. As seen in FIG. 1, the point 52 extends above the circuit board 14.

If the push pin assembly 34 is inserted only part way through a mounting hole, the barbs 56 can remain flexed radially inwardly for a long period of time. In the illustrated embodiment of the invention the body 46 is molded of polycarbonate rather than a material such a nylon. This minimizes the tendency of the legs 68 and 70 to take a set or permanently deform with the barbs retracted. The tendency to permanently deform is also opposed by the strut 72. If the assembly 34 is fully inserted after remaining partly inserted, the legs 68 and 70 are able to flex radially outwardly to lock the body 46 in place.

The diameter of the coil spring 48 is larger than the diameter of the mounting hole 42. The spring abuts the base 38 of the heat sink 32 as the pin assembly 34 is installed. When the pin assembly 34 is fully seated, the spring 34 is held in compression between the inner shoulder 62 of the head 50 and the base 38 of the heat sink 32. The forces applied by the springs 48 urge the heat sink 32 toward the bottom surface of the circuit board 14 and compress the soft, compliant interface pad 36 between the heat sink 32 and the circuit board 14. As a result, the interface pad is pressed into intimate contact with the lower end 24 of each of the array of vias 20 and is pressed into intimate contact with the heat sink base 38.

As the modules 16 operate, heat generated within the modules flows from the modules through the leads 30 and contact pads 28 to the vias 20. Heat then flows from the vias 20 and into the interface pad 36, while the electrical isolation of the vias 20 is maintained by the electrically insulating interface pad 36. Heat flows from the interface pad 36 to the heat sink 32 and is dissipated into the surrounding air from the fins 40. Because all of the modules 16 are in common heat transfer relation with the single heat sink 32, temperature variations between individual modules are reduced and the electrical timing of the modules is maintained consistent with improved timing performance. The cooling assembly 12 can easily be removed and does not interfere with rework of the array of modules 16.

While the present invention has been described with reference to the details of the embodiment of the invention shown in the drawing, these details are not intended to limit the scope of the invention as claimed in the appended claims.

What is claimed is:

1. A push pin assembly for mounting a heat sink to a circuit board, the heat sink and the circuit board having aligned mounting holes, said push pin assembly comprising:

a pin body formed of a molded plastic material and having a push head at a first end and a point at the second end inserted through the mounting hole of the heat sink and through the aligned mounting hole of the circuit board from an entry surface to an exit surface of the circuit board;

said body having a shank extending between said head and said point;

said second end having barbs projecting radially beyond said shank and engaging the exit surface of the circuit board after insertion;

a coil spring captured around said shank and beneath said head and urging the heat sink toward the entry surface of the circuit board;

a slot extending diametrically entirely through said point and said shank to define a pair of discrete spaced apart legs and to impart flexibility to said legs; and a strut portion of said body closing the end of said slot and interconnecting the ends of said legs at the distal end of said point.

2. A push pin assembly as claimed in claim 1, said strut portion defining a blunt tip of said point.

3. A push pin assembly as claimed in claim 1, said body being formed of polycarbonate.

* * * * *